United States Patent Office 2,738,319

Patented Mar. 13, 1956

2,738,319

METAL MERCAPTIDES AS PHOTOSENSITIZERS IN PHOTOPOLYMERIZATION

Roland J. Kern, Dayton, Ohio, assignor to Monsanto Chemical Company, St. Louis, Mo., a corporation of Delaware No Drawing. Application December 5, 1952, Serial No. 324,391

19 Claims. (Cl. 204—158)

This invention relates to the photopolymerization of unsaturated organic compounds.

It has long been known that unsaturated organic compounds can be photopolymerized under the influence of light in the ultraviolet range. Most ethylenically unsaturated organic compounds are photopolymerizable with proper choice of conditions.

It is an object of this invention to effect the photopolymerization of photopolymerizable unsaturated organic compounds. Another object of the invention is to effect the polymerization of ethylenically unsaturated organic compounds by action of ultraviolet light and a small amount of an added material acting as photosensitizer. Another object of the invention is to speed up the photopolymerization of unsaturated organic compounds. Still another object is to provide as a photosensitizer a metallic compound, which, under the influence of light in the ultraviolet range, decomposes and increases the rate of polymerization of vinylidene compounds. A further object is to increase the rapidity of the photopolymerization of styrene, acrylonitrile, vinyl acetate, methyl methacrylate, methyl vinylpyridine, and other photopolymerizable materials. Further objects and advantages of the invention will be apparent to one skilled in the art from the accompanying disclosure and discussion.

In accordance with preferred embodiments of my invention, a photopolymerizable unsaturated organic compound, e. g., styrene, is subjected to the influence of light in the ultraviolet range, preferably containing effective amounts of light having wave lengths of 2,000 to 4,000 Angstrom units, while having dispersed in said unsaturated compound a small amount of a mercury, lead, silver, or zinc mercaptide free from nitro, hydroxyl, and primary amino groups on aromatic carbon effective to photosensitize, i. e., speed up the polymerization. A preferred photosensitizer of my invention is mercuric phenyl mercaptide; another preferred photosensitizer is mercuric tertiary butyl mercaptide. As indicated, these compounds act to increase the rate of polymerization occurring under the influence of light in the ultraviolet range and can be termed photosensitizers or photopolymerization catalysts.

Mercuric phenyl mercaptide is readily made by reacting mercuric oxide with phenyl mercaptan, otherwise known as thiophenol, in methanol-chloroform solution, resulting in the formation of mercuric phenyl mercaptide which can be designated by the formula:

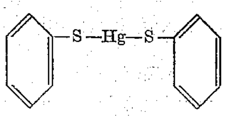

One preferred group of photosensitizers of which this compound is exemplary comprises the mercaptides of mercury and a mercaptan selected from the group consisting of phenyl mercaptans and substituted phenyl mercaptans, wherein said substituted phenyl mercaptans are free from nitro, hydroxyl, and primary amino groups on aromatic carbon, but otherwise can be substituted with any of a large number of atoms or radicals so long as said substituents do not destroy the effectiveness of the compound for the purpose intended. As examples of suitable substituents on the phenyl group can be mentioned alkyl, phenyl, bromo, —$NR_2$, and naphthyl, or the phenyl group in the mercaptan can be fused with another phenyl group forming a naphthyl radical which can be free from substituents or can have other substituents or in turn be fused with another phenyl group. Within this preferred group of mercaptides just discussed can be mentioned, by way of example, the mercuric mercaptides of phenyl mercaptan, biphenyl mercaptan, α-naphthyl mercaptan, 3-bromobiphenyl mercaptan, para-dimethylaminothiophenol, and isopropylthiophenol.

Another preferred group of photosensitizers comprises the mercaptides of mercury and a mercaptan selected from the group consisting of alkyl mercaptans and substituted alkyl mercaptans wherein the substituents are as described in the preceding paragraph with reference to substituted phenyl mercaptans. Within this preferred group of alkyl and substituted alkyl mercaptides can be mentioned, by way of example, the mercuric mercaptides of tertiary butyl mercaptan, ethyl mercaptan, bromobutyl mercaptan, n-dodecyl mercaptan, 4-[N,N-dimethylamino]-2-ethylhexylmercaptan, methyl 4-mercapto-n-butyl ether, cyclohexylamyl mercaptan, and mercaptide made by reaction of mercuric oxide with mixed tertiary mercaptans that are prepared by reacting hydrogen sulfide with $C_{12}$–$C_{14}$ olefin polymers.

Although mercury mercaptides are preferred, the mercaptides of lead, silver, and zinc and the mercaptans discussed herein are also within the purview of my invention.

It is preferred that the organic radicals of the mercury, lead, silver, or zinc mercaptides to be used in accordance with this invention be such that the mercaptides under the conditions of photopolymerization will decompose to give free metal, and preferably free metal as the sole metal-containing residue. Mercuric phenyl mercaptan gives free mercury as the sole metallic residue and this free mercury can agglomerate and settle from the reaction mixture and thereby be easily removed. The advantage of this is that the final product is free from contamination with metal-containing residues, and the reaction mixture during photopolymerization is less opaque to ultraviolet radition because of the aggomeration of the mercury residue.

Broadly speaking, the photosensitizers of the present invention comprise mercaptides of a heavy metal selected from the group consisting of mercury, lead, silver and zinc, said mercaptides being free from nitro, hydroxyl or primary amino groups attached to aromatic carbon. Such mercaptides can be indicated by the general formula: $(RS)_xM$, wherein R is an organic radical, M is selected from the group consisting of Hg, Pb, Ag and Zn, and $x$ is an integer equal to the valency of M in the formula, R, however, being free from nitro, hydroxyl, and primary amino groups attached to aromatic carbon. Mercaptans whose mercaptides can be employed include those containing the alkyl, aryl, aralkyl, alkaryl, alkenyl, cycloalkyl, cycloalkenyl, or said radicals substituted with hydrocarbon or non-hydrocarbon radicals as discussed hereinabove. As further examples can be mentioned methylcyclohexyl mercaptan, benzyl mercaptan, and 3-mercapto-heptene-1.

Of the mercaptides which can be used in accordance with this invention, those of mercury are particularly preferred since they are stable, have definite composition and can be isolated in pure state. Also as discussed above, free mercury is formed from mercury mercaptides during the photopolymerization, and the free mercury is most easily removed from the reaction system.

The quantity of metal mercaptide to be used as photosensitizer will, of course, be dependent upon many variables including the particular metal mercaptide, the wave length of ultraviolet light employed, the intensity of the light employed, the time of irradiation, the polymerizable unsaturated monomer or monomers present, the temperature, and the pressure. In any event, the amount of metal mercaptide photosensitizer is small, but sufficient is employed to be effective as a photosensitizer. Usually the amount is within the range of 0.01 to 5 weight per cent based upon the amount of monomeric material initially present. It will seldom be necessary to employ more than 1 or 2 per cent of the added photosensitizer. It is preferred to use a metal mercaptide which is sufficiently soluble in the monomeric material to have present dissolved in the liquid phase the desired effective amount of photosensitizer. More than the solubility limit of a particular metal mercaptide can sometimes be used to advantage, as the undissolved portion can go into solution during the photopolymerization as that dissolved becomes used up by decomposition.

Any photopolymerizable unsaturated organic compound can be used in the practice of my invention. Such compounds are preferably ethylenically unsaturated, i. e., contain at least one non-aromatic double bond between adjacent carbon atoms. The invention is most advantageously applied to photopolymerizable vinyl or vinylidene compounds containing a $CH_2{=}C<$ group activated by direct attachment to a different negative group, i. e., halogen, $>C{=}O$, $—C{\equiv}N$, $—C{\equiv}C—$, $—O—$, or aryl. It is understood that the term "vinylidene compounds" as used herein, unless otherwise limited, includes vinyl compounds, i. e., a vinylidene compound having one of the two free valences of the vinylidene radical satisfied by hydrogen. Ordinarily the compound in question contains only one $CH_2{=}C<$ group but compounds containing more than one such group are also contemplated within the broad scope of the invention. The numerous photopolymerizable vinyl and vinylidene compounds are very advantageously treated using the principles of my invention. Among these may be mentioned the vinylaryl compounds, e. g., styrene, p-chlorostyrene, vinylnaphthalenes; vinyl esters, e. g., vinyl acetate; vinyl or vinylidene halides, e. g., vinyl chloride, vinylidene chloride, vinylidene chlorofluoride; acrylic acid and its derivatives, e. g., acrylic acid, acrylonitrile, methacrylonitrile, methyl methacrylate, acrylamide, methyl ethyl acrylamide; vinyl heterocyclic compounds such as vinyl pyridines, e. g., methyl vinyl pyridine. Other suitable compounds which can be mentioned include vinyl methyl ketone, dimethyl vinylethinyl carbinol, chloroprene. Vinyl and vinylidene compounds which are photopolymerizable are known to the art and need not be further enumerated here.

Conditions of temperature and pressure at which the photopolymerization is effected can be varied over a wide range. It will be understood that optimum conditions will be greatly dependent upon the particular monomeric material being polymerized. Many photopolymerizations are readily effected at temperatures of from 0° C. to 150° C. when the monomer is exposed to a light source rich in ultraviolet light. The present knowledge of the art on photopolymerizations is sufficient to permit choice of suitable operating conditions for any particular monomer, and simple tests can be run if necessary to determine the conditions most suitable for any particular system. At a given temperature, the practice of my invention makes possible a more rapid photopolymerization than is effected in the absence of my added photosensitizer.

As with most chemical reactions, occasional combinations of monomer, photosensitizer, and/or conditions of reaction will be found which do not result in accelerated photopolymerization. Thus, for example, lead tert.-butyl mercaptide at room temperature decomposes to give a finely dispersed suspension of black material in methylvinylpyridine without resulting in much polymerization, and it reacts with vinyl acetate in the cold and dark to convert the yellow mercaptide to a white solid without polymerization. On the other hand, lead tert.-butyl mercaptide at room temperature is an effective photosensitizer for acrylonitrile and numerous other monomers. Thus, the invention can be stated to involve the use of any mercaptide of mercury, lead, silver, or zinc effective to photosensitize, i. e., accelerate, the photopolymerization of a particular photopolymerizable unsaturated organic compound under the influence of light in the ultraviolet range. Those skilled in the art, having had the benefit of the present disclosure, can determine with the very simplest of tests those combinations of monomer, photosensitizer, amount of photosensitizer, light intensity, and reaction conditions and system, suitable in carrying out the present invention.

The following examples are presented to illustrate some preferred methods of practicing the invention, but numerous variations of materials, proportions, and conditions can be employed without departing from the invention in its broadest aspects.

*Example 1*

Twenty-five grams of styrene monomer was placed in each of three Pyrex glass test tubes. In one test tube was placed 1 weight per cent based on the styrene monomer, of diphenyl disulfide, a compound known in the prior art to be an excellent photosensitizer. In another of the tubes was placed 0.1 weight per cent of mercuric phenyl mercaptide. The third tube contained no material other than the styrene. The tubes were sealed under a nitrogen atmosphere. The tubes were equally irradiated for a period of 24 hours by a General Electric type S–1 bulb (a mercury vapor bulb giving light rich in ultraviolet range) at a distance of 4 to 5 inches, the tubes being held at 40° C. during irradiation. The contents of each tube were then quantitatively poured into a large excess of methanol. The precipitated polymer was washed twice again with methanol and dried, and the resulting insoluble polymer from each tube weighed.

The yield of insoluble polymer was 4 weight per cent based on styrene monomer in the control containing no added photosensitizer, 21 per cent in the tube containing 1 per cent diphenyl disulfide, and 48 per cent in the tube containing 0.1 per cent mercuric phenyl mercaptide. In the tube containing mercuric phenyl mercaptide a small globule of mercury collected in the bottom and was readily separated from the polymer.

*Example 2*

Mercuric phenyl mercaptide (0.020 gram) and 20 cc. of acrylonitrile were sealed under nitrogen in a Pyrex test tube. The tube was then irradiated one hour with a General Electric B–H–4 bulb at a distance of one to two inches at 40–50° C. The exceptionally snow-white polymer was then precipitated and washed in methanol and dried. A 32 per cent conversion was obtained. No polymer was obtained from a blank of acrylonitrile under the same conditions.

*Example 3*

Methyl methacrylate containing 0.1 weight per cent of mercuric phenyl mercaptide was photopolymerized as described in Example 2 above for 7 hours. A 28 per cent conversion to polymer was obtained. A blank of methyl methacrylate, i. e., methyl methacrylate containing no mercuric phenyl mercaptide, gave 7 per cent conversion.

*Example 4*

A 0.1 per cent solution of mercuric tertiary butyl mercaptide and vinyl acetate was irradiated 7 hours under conditions otherwise as described in Example 2. The material was then diluted with 2 volumes of benzene and precipitated in excess hexane yielding polymer in an amount of 31 weight per cent of vinyl acetate charged. A blank of vinyl acetate gave no polymer when irradiated under the same conditions.

*Example 5*

Acrylonitrile containing 0.1 per cent of lead tertiary butyl mercaptide was irradiated 3 hours as described in Example 2. Purification by methanol washing yielded polymer amounting to 5–6 per cent conversion.

*Example 6*

2-methyl-5-vinylpyridine containing 0.1 weight per cent mercuric phenyl mercaptide was irradiated as described in Example 2 for 24 hours resulting in a 33 per cent conversion to polymer. A blank of 2-methyl-5-vinylpyridine free from added material and irradiated under the same conditions gave a yield of 21 per cent polymer.

*Example 7*

Methacrylonitrile containing 0.1 weight per cent mercuric phenyl mercaptide and irradiated as described in Example 2 for 24 hours yielded 4 per cent polymer. A methacrylonitrile blank free from added photosensitizer and irradiated under the same conditions gave no polymer.

Any suitable source of radiation providing wave lengths in the ultraviolet range, preferably within the range of 2,000 to 5,000 Angstroms and still more preferably within the range of 2,000 to 4,000 Angstroms, can be used. Common sources include mercury lamps and arcs, carbon arcs and hydrogen discharge tubes. Of course, sunlight also contains substantial amounts of ultraviolet radiation and can be used if desired. Radiation of sufficient intensity from tungsten lamps can be employed. In any event, light within the ultraviolet range of sufficient intensity and for a sufficient time is used to effect the desired extent of polymerization, which can be very small, for example, 1 per cent of the monomer polymerized but which, for practical reasons, should be considerably larger.

The vessel in which the polymerization is conducted should be transparent to light of the desired wave length so that the light can pass through the sides of the container. Suitable glasses are available commercially, and include borosilicate ("Pyrex"), "Vycor," or soft glass. Alternatively, the source of light can be placed directly over the surface of the monomer in a container, or can be placed within the reaction mixture itself.

Photopolymerizations are most often effected in accordance with my invention in a mass polymerization system, i. e., the sole liquid phase is composed of monomeric material, which can be one or a plurality of photopolymerizable unsaturated organic compounds. The polymerization can also be effected in the presence of added solvents for the monomer and/or polymer, e. g., benzene, aliphatic hydrocarbons. Less preferably the photopolymerizations can be effected in the suspension or emulsion systems wherein the monomeric material is suspended in small globules or emulsified in very small particles in a non-solvent, most commonly water, with or without the presence of added suspending or emulsifying agents. Such techniques are well-known and understood in the art. It is preferred that free oxygen be absent during the polymerization. Ordinarily the mercaptide photosensitizer is the only material added to the system for the purpose of increasing the polymerization rate or decreasing the temperatures at which a given polymerization rate is attained. However, it is possible to add other photosensitizers, or known polymerization catalysts such as organic peroxides. The polymerizations effected in accordance with this invention include not only homopolymerizations, i. e., polymerization of one monomer alone, but also the copolymerization of two or more monomers to form at least some polymer containing units of more than one monomer in the polymer molecule. Monomers containing not over 30 carbon atoms per molecule are generally most useful.

Such a large number of uses is known for polymers that it seems superfluous to attempt to enumerate the uses to which the products of this invention can be put. Such uses, of course, will depend upon the monomeric material polymerized. By way of example, it can be stated that polystyrene made in accordance with the examples given above is useful as a molding powder and can be injection molded or compression molded by standard techniques. The same is true of solid thermoplastic polymers made from other monomers by the practice of this invention. On the other hand, some monomers or mixtures of monomers will tend to give rubbery products. In general, the characteristics of a product will be in accordance with the monomer used and the temperature conditions at which it is photopolymerized, as will be understood by those skilled in the art.

While the invention has been described with particular reference to various preferred embodiments thereof, it will be appreciated that numerous modifications and variations are possible without departing from the invention.

I claim:

1. In the photopolymerization of photopolymerizable unsaturated organic compounds under the influence of light in the ultraviolet range, the improvement which comprises employing a small amount of a mercaptide of a metal selected from the group consisting of mercury, lead, silver and zinc effective to photosensitize said polymerization, said mercaptide being free from nitro, hydroxyl and primary amino groups on aromatic carbon.

2. In the photopolymerization of photopolymerizable unsaturated organic compounds under the influence of light in the ultraviolet range, the improvement which comprises employing a small amount of a lead mercaptide effective to photosensitize said polymerization, said mercaptide being free from nitro, hydroxyl and primary amino groups on aromatic carbon.

3. In the photopolymerization of photopolymerizable unsaturated organic compounds under the influence of light in the ultraviolet range, the improvement which comprises employing a small amount of a mercury mercaptide effective to photosensitize said polymerization, said mercaptide being free from nitro, hydroxyl and primary amino groups on aromatic carbon.

4. A process according to claim 3 wherein said mercury mercaptide is mercuric phenyl mercaptide.

5. In the photopolymerization of a photopolymerizable vinylidene compound having a $CH_2=C<$ group activated by direct attachment to a different negative group selected from the class consisting of halogen, $>C=O$, $-C\equiv N$, $-C\equiv C$, $-O-$, and aryl, under the influence of light in the ultraviolet range, the improvement which comprises employing a small amount of a mercaptide of a metal selected from the group consisting of mercury, lead, silver and zinc effective to photosensitize said polymerization, said mercaptide being free from nitro, hydroxyl and primary amino groups on aromatic carbon.

6. A process according to claim 5 wherein said metal is mercury.

7. A process according to claim 5 wherein said mercaptide is a mercaptide of mercury and a mercaptan selected from the group consisting of phenyl mercaptan and substituted phenyl mercaptans.

8. A process according to claim 5 wherein said vinylidene compound is a vinyl aryl compound.

9. A process according to claim 8 wherein said vinyl aryl compound is styrene.

10. A process according to claim 5 wherein said vinylidene compound is a vinyl ester.

11. A process according to claim 10 wherein said vinyl ester is vinyl acetate.

12. A process according to claim 5 wherein said vinylidene compound is selected from the group consisting of acrylic acid and photopolymerizable derivatives thereof.

13. A process according to claim 12 wherein said compound is acrylonitrile.

14. A process according to claim 12 wherein said compound is methyl methacrylate.

15. A process according to claim 5 wherein said metal is lead.

16. A process according to claim 5 wherein said metal is silver.

17. A process which comprises admixing with monomeric styrene a small but effective amount less than one weight per cent of mercuric phenyl mercaptide as photosensitizer, and subjecting the resulting admixture to the photopolymerizing effect of radiation within the range of 2,000 to 4,000 Angstrom units of sufficient intensity and for a sufficient time to polymerize at least a portion of said styrene.

18. A process according to claim 17 including the step of separating from the reaction mixture a globule of mercury metal formed by decomposition of said mercuric phenyl mercaptide during said photopolymerization.

19. A process according to claim 1 wherein said light includes radiation within the range of 2,000 to 4,000 Angstrom units.

References Cited in the file of this patent

UNITED STATES PATENTS

| | | |
|---|---|---|
| 2,351,108 | Collins | June 13, 1944 |
| 2,460,105 | Richards | Jan. 25, 1949 |
| 2,575,135 | Schulze et al. | Nov. 13, 1951 |
| 2,600,683 | Pearson | June 17, 1952 |

FOREIGN PATENTS

| | | |
|---|---|---|
| 654,026 | Great Britain | May 30, 1951 |